United States Patent [19]

Gabor

[11] 3,999,126
[45] Dec. 21, 1976

[54] TEST DEVICE FOR SIMULTANEOUSLY DISPLAYING THE LEVEL OF LOGIC SIGNALS IN A PLURALITY OF CIRCUITS

[75] Inventor: Robert J. Gabor, Mentor, Ohio

[73] Assignee: A P Products Incorporated, Painesville, Ohio

[22] Filed: Apr. 17, 1975

[21] Appl. No.: 561,112

[52] U.S. Cl. .............................. 324/133; 324/51; 340/176; 340/252 R

[51] Int. Cl.² ................. G01R 19/16; G01R 31/02

[58] Field of Search ............ 324/51, 72.5, 73, 122, 324/133; 340/252 R, 252 P, 214, 411, 176, 324 R; 315/132, 135

[56] References Cited

UNITED STATES PATENTS

| | | | |
|---|---|---|---|
| 2,895,106 | 7/1959 | Taunt | 324/133 UX |
| 3,021,515 | 2/1962 | Christian et al. | 340/252 R X |
| 3,040,243 | 6/1962 | Weiss | 340/252 R X |
| 3,140,422 | 7/1964 | McGee | 340/252 R X |
| 3,163,708 | 12/1964 | McMains | 340/214 UX |
| 3,217,244 | 11/1965 | Glover | 324/51 |
| 3,333,188 | 7/1967 | Eagle | 324/73 R |
| 3,452,271 | 6/1969 | Ketter | 324/51 X |
| 3,566,401 | 2/1971 | Smith et al. | 340/176 X |
| 3,627,408 | 12/1971 | Fergason | 324/96 X |
| 3,667,037 | 5/1972 | Kierce | 324/133 X |
| 3,667,263 | 5/1972 | Garfein et al. | 324/96 X |
| 3,670,245 | 6/1972 | Gordon | 324/73 R |
| 3,746,973 | 7/1973 | McMahon | 324/73 R X |
| 3,836,843 | 9/1974 | Yonce | 324/51 |
| 3,898,557 | 8/1975 | Strock | 324/51 |

Primary Examiner—Gerard R. Strecker
Attorney, Agent, or Firm—Donnelly, Maky, Renner & Otto

[57] ABSTRACT

A test clip suitable for connection to a plurality of terminals at which appear respective logic signals representing those occurring in logic circuits provides an indication of the logic level of such signals. The circuit for effecting such indication is entirely self-contained requiring no external power source or grounding connection and includes a plurality of respective input lines connectable to such terminals with a respective indicator shunted by a reverse poled diode connected to each input line and one common connection for all the diodes and indicators. Thus, for example, a logic 1 signal occurring on one of the input lines will effect a current flow through a respective indicator to change the state thereof with a return current flow path being provided from the common connection through at least one of the shunting diodes connected to another input line then at logic 0 relatively ground potential. The circuit may be easily extended to test simultaneously as many circuits as desired, and such test circuit is effective to operate on positive logic as shown as well as on negative logic, the latter being achieved simply by reversal of the shunting diodes.

12 Claims, 3 Drawing Figures

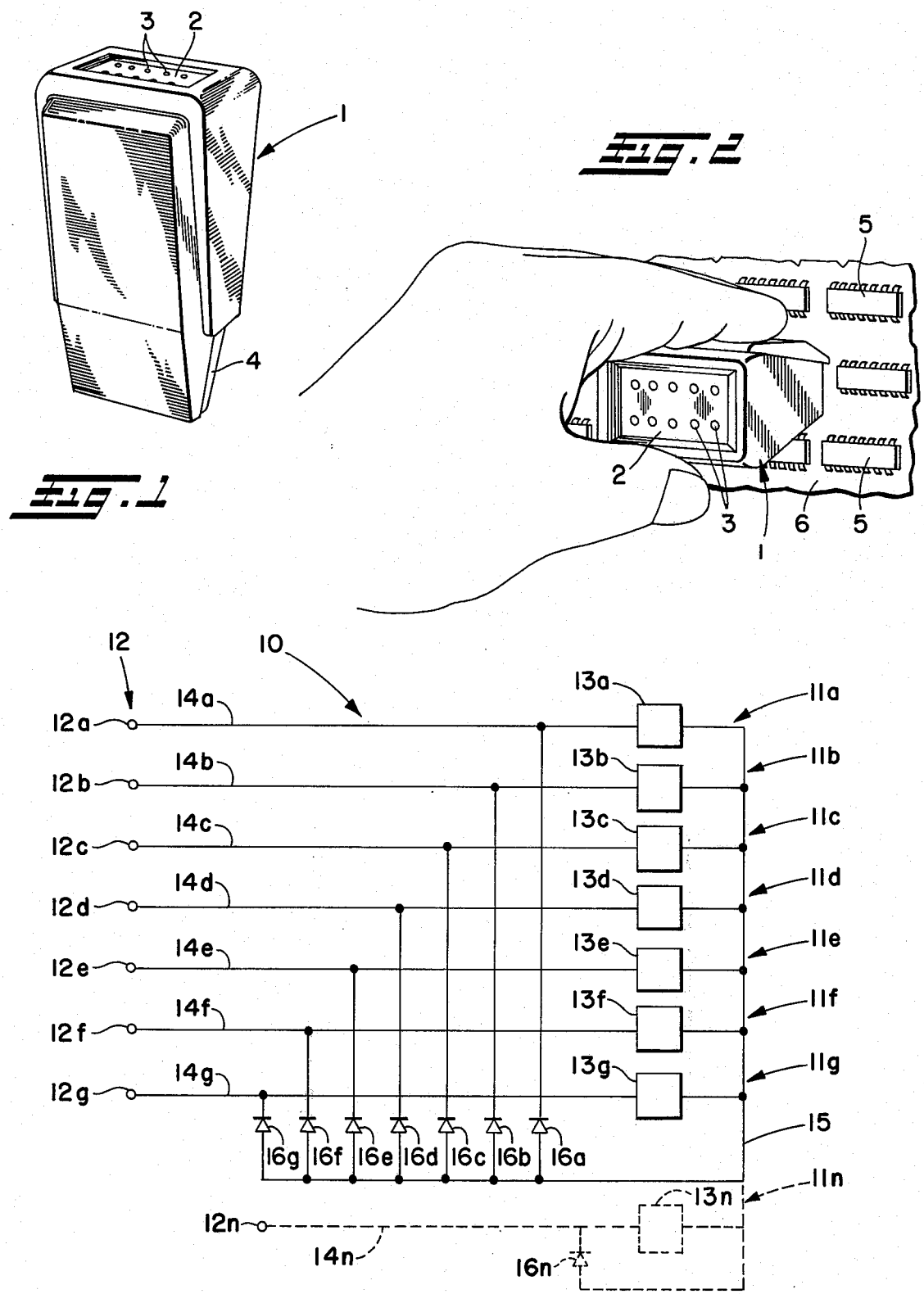

TEST DEVICE FOR SIMULTANEOUSLY DISPLAYING THE LEVEL OF LOGIC SIGNALS IN A PLURALITY OF CIRCUITS

BACKGROUND OF THE INVENTION

This invention relates to a test device for monitoring one or more logic points in a circuit to determine the logic level or state thereof and to provide a display or indication of the state of each monitored point, and more particularly relates to a self-contained circuit including display elements responsive to the logic signals at respective logic points.

It is often important to determine whether one or more logic points in an overall logic circuit are at logic 0 or logic 1 levels for the purpose of determining proper circuit operation as well as to detect faults. Moreover, in view of the complexity of circuits especially in computers and the cost of computer time such determinations should be able to be made easily and rapidly.

Prior art devices for monitoring the logic level of one or more logic points have required, for example, transistorized circuitry including light emitting diode indicators as well as an external power supply for energizing such transistorized circuit. Although such prior art systems are effective to determine logic level, the individual transistorized circuits are themselves subject to possible failures due to the number of elements included in each and are often cumbersome due to the requirement for connection to an external power supply.

SUMMARY OF THE INVENTION

The instant invention includes a circuit for monitoring a plurality of logic points or test points to determine the level of logic signals appearing thereat. The total test circuit is entirely self-contained and does not require any external power source connection. Moreover, the circuit includes a respective indicator and shunting diode connected at one side to a respective input line and at the other side to a common connection and relies on the power of a logic 1 signal input, for example, to provide current to the indicator with a ground circuit being provided through a diode connected to an input having a logic 0 thereon. The test device is capable of determining the level of logic signals appearing at a plurality of logic points and may be extended to any convenient number depending on the array of logic or test points provided.

Accordingly, it is a primary object of the invention to provide a logic test and display device improved in the noted respects.

An additional object of the invention is to provide an entirely self-contained test circuit for use in a logic level indicator device.

A further object of the invention is to provide a logic level indicator device for monitoring and displaying simultaneously the level of logic signals occurring at a plurality of logic test points in logic circuitry.

Another object of the invention is to provide a reliable logic level indicator device having a minimum number of circuit components for monitoring and displaying the level of logic signals occurring at a plurality of circuit test points.

Still an additional object of the invention is to provide a logic level indicator device which may be easily expanded to determine the level of logic signals occurring at numerous circuit test points and may be easily adapted for use with either positive or negative logic.

Still a further object of the invention is to monitor one or more logic points in a circuit, wherein the logic point may be at either logic 1 or logic 0 signal levels, and to provide a visual indication of the logic level state of each monitored point.

These and other objects are realized in the instant invention which comprises a circuit for such a logic level indicator device including a plurality of input terminals connectable to respective circuit test points, respective monitoring circuits connected to the input terminals, each including an indicator device responsive to such logic signals and a reverse poled shunting diode with a common connection remote from the input terminals provided for all of the indicators and diodes. A primary advantage of the instant invention is that the test circuit thereof seeks the ground return current path automatically enabling the inputs thereto to be connected to any circuit arbitrarily without the need to make any external ground connections.

To the accomplishment of the foregoing and related ends, the invention, then, comprises the features hereinafter fully described, the following description and the annexed drawing setting forth in detail a certain illustrative embodiment of the invention, this being indicative, however, of but one of the various ways in which the principles of the invention may be employed.

BRIEF DESCRIPTION OF THE DRAWING

In the annexed drawing:

FIG. 1 is a perspective view of a logic level indicator device in which the circuit of the invention may be incorporated;

FIG. 2 is an environmental view showing a connection of the logic level indicator of FIG. 1 to a respective test point array of a computer; and FIG. 3 is a schematic electric circuit diagram of the test circuit of the invention.

DESCRIPTION OF THE PREFERRED EMBODIMENT

Referring now to the drawing wherein like reference numerals refer to like elements in the several figures, and particularly to FIGS. 1 and 2, a logic level indicator is generally indicated at 1. The logic level indicator includes a display portion 2 having a number of display elements 3, which may be, for example, bipolar liquid crystals operable in a DC mode, such as those manufactured by International Liquid Crystals of Cleveland, Ohio. Such liquid crystals normally contain non-aligned molecules that block light; however, upon being energized by an electric current, for example, as low as 1/10 microamp, the molecules align to permit light transmission through the liquid crystal. In one form of the invention a reflective element, not shown, may be located behind each respective liquid crystal, whereby upon energization of the liquid crystal ambient light transmitted through the liquid crystal will be reflected back therethrough by the reflector to provide an indication of such energization. Alternatively, a normally on pilot light, for example operated by an internal battery, may be located within the logic level indicator itself to provide a light source for transmission of light through an energized liquid crystal. Moreover, the liquid crystals may be replaced by indicator lamps or other similar devices, if desired, provided that such devices are capable of being energized by the power developed at each of the respective circuits to be tested.

The logic level indicator 1 also includes a connector portion 4 adapted for connection to respective test point arrays 5, shown in FIG. 2, located, for example, in an output or test portion 6 of a computer. The connector portion 4 may be similar to the test clip disclosed in U.S. Pat. No. 3,506,949, issued Apr. 14, 1970, and may be extended or reduced in total number of contact elements thereof, depending on the application required.

Turning now more particularly to FIG. 3, a test circuit, which is preferably located within the body of the logic level indicator 1, is indicated generally at 10. The test circuit includes a plurality of monitor circuits 11a through 11g, which are respectively coupled by input terminals 12a through 12g to receive the signals occurring at the various points in the test point arrays 5, for example from logic circuits in a computer. Each of the monitor circuits includes a respective display element 13a through 13g having a first terminal thereof connected by an input line 14a through 14g to a respective input terminal 12a through 12g. A second terminal of each of the display elements is coupled to a common connection 15.

Each monitor circuit 11 also includes a respective diode 16a through 16g connected in parallel or shunt relation across the respective display elements in reverse poled relation relative to the normal logic signals occurring in the test point arrays to be monitored, thus assuring that any current flowing from a monitored test point flows through a display element. The cathode terminal of each diode is connected to a respective input line and the anode terminal of each diode is connected to the common connection 15. The respective diodes 16 provide a return current path for any energized display elements 13 to an input line 14 and input terminal 12 that is not energized, therefore being at ground potential relative to the energized input terminal and input line.

Although the test circuit 10 is illustrated in FIG. 3 and described herein in detail relative to positive logic, whereby a logic 1 signal is more positive than a logic 0 signal, such test circuit may be similarly utilized with negative logic by reversing each of the diodes 16 in the respective monitor circuits 11. Moreover, an additional monitor circuit 11n including an input terminal 12n, a display element 12n, an input line 14n and a reverse poled shunting diode 16n is shown in dotted outline to illustrate that the test citcuit 10 can be easily extended or reduced to include more or fewer than the number of monitor circuits 11 shown in solid lines.

In normal operation of the test circuit 10, assuming for example, that a first logic level signal or logic 1 is represented by a positive 10 volts and a second logic level signal or logic 0 is represented by a relative ground potential, a logic 1 signal appearing on an input terminal 12 such as input terminal 12a energizes the corresponding liquid crystal display element 13a causing the molecules thereof to align. A return current path from such display element is provided through the common connection 15 and any of the diodes 16 which is connected to an input terminal 12 then at logic 0 or relative ground potential. Since it is unlikely that all of the test points in the test point array 5 will be simultaneously at logic 1 and since one of such test point is often normally maintained at ground potential for test purposes, there should always be at least one input terminal 12 maintained at ground potential to provide an adequate return current path of any or all but one simultaneously energized liquid crystal display elements 13.

It should now be understood that the invention is capable of monitoring and indicating the level of logic signals occurring at one or more points in a logic circuit and may be used with either positive or negative logic. Although the preferred embodiment utilizes a liquid crystal display, similar circuitry may be utilized with other types of DC indicator devices, the only requirement being that the logic point tested must be capable of supplying the source current to operate the indicator or display device. Moreover, the test circuit 10 requires a minimum number of elements thus reducing any possibility of failure, and by using liquid crystal display elements has extremely low current requirements to avoid any detrimental affects to the tested circuitry and the signals occurring therein.

The embodiments of the invention in which an exclusive property or privilege is claimed are defined as follows:

1. A test device for simultaneously displaying the level of electrical logic signals occurring in a plurality of circuits, comprising a plurality of input circuit means for providing a respective connection between each of said plurality of circuits and said test device; a plurality of electrically responsive display means for indicating the level of such logic signals, each display means having respective first and second terminals, the former being connected to a respective input circuit means and the latter all being coupled in a common connection; a plurality of diode means for conducting electric current in a single direction, each diode means having first and second terminals, and each of said diode means being connected at one of said first and second terminals in reverse poled relation to a respective one of said input circuit means, the other ones of said first and second terminals being coupled to said common connection; and whereby occurrence of a first logic level signal on any one of said input circuit means effects current flow through respective display means connected thereto with a return current path being provided through said common connection and at least one of said diode means connected to one of said input circuit means on which a second logic level signal different from such first logic level signal is occurring.

2. A test device for simultaneously displaying the level of logic signals occurring in a plurality of circuits as set forth in claim 1, wherein each of said plurality of diode means is connected in shunt relation across a respective one of said plurality of display means.

3. A test device for simultaneously displaying the level of logic signals occurring in a plurality of circuits as set forth in claim 2, further comprising a main body, said main body including a display portion in which said plurality of display means are disposed for visual viewing, and a connector portion adapted for connection to a test point array to provide such logic signals to said respective input circuit means.

4. A test device for simultaneously displaying the level of logic signals occurring in a plurality of circuits as set forth in claim 1, wherein each of said display means comprises a display means having first and second distinguishable states, said display means normally being in such second state when not energized and being energizable to said first state when a current flow indicative of occurrence of said first logic level energizes the same.

5. A test device for simultaneously displaying the level of logic signals occurring in a plurality of circuits as set forth in claim 4, wherein power for energizing respective display means is provided from respective ones of said plurality of circuits through respective input circuit means.

6. A test device for simultaneously displaying the level of logic signals occurring in a plurality of circuits as set forth in claim 1, wherein said display means comprise liquid crystal means 7. A test device for simultaneously displaying the level of logic signals occurring in a plurality of circuits as set forth in claim 6, wherein said liquid crystal means comprise bipolar liquid crystal means operable in a DC mode.

8. A test device for simultaneously displaying the level of logic signals occurring in a plurality of circuits as set forth in claim 1, wherein said first and second logic level signals are respectively logic 1 and logic 0 signals represented by respective voltage levels.

9. A test device for simultaneously displaying the level of logic signals occurring in a plurality of circuits as set forth in claim 8, wherein such logic 1 signal level is represented by a positive voltage relative to such logic 0 signal level.

10. A test device for simultaneously displaying the level of logic signals occurring in a plurality of circuits as set forth in claim 9, wherein each of said first and second terminals of said diode means comprise cathode and anode terminals, each cathode terminal being connected to a respective input circuit, and each anode terminal being connected to said common connection.

11. A test device for simultaneously displaying the level of logic signals occurring in a plurality of circuits as set forth in claim 8, wherein such logic 1 signal level is represented by a negative voltage relative to such logic 0 signal level.

12. A test device for simultaneously displaying the level of logic signals occurring in a plurality of circuits as set forth in claim 11, wherein each of said first and second terminals of said diode means comprises anode and cathode terminals, each anode terminal being connected to a respective input circuit, and each cathode terminal being connected to said common connection.

* * * * *